(12) United States Patent
Tsai

(10) Patent No.: US 6,586,299 B1
(45) Date of Patent: Jul. 1, 2003

(54) MIXED MODE PROCESS

(75) Inventor: Ching-Huei Tsai, Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 10/065,294

(22) Filed: Oct. 1, 2002

(51) Int. Cl.⁷ .......................................... H01L 21/8244
(52) U.S. Cl. ................... 438/238; 438/239; 438/647; 438/657; 438/253
(58) Field of Search ................... 438/238, 239, 438/250, 253, 647, 657

(56) References Cited

U.S. PATENT DOCUMENTS

| | | | | |
|---|---|---|---|---|
| 5,618,749 A | * | 4/1997 | Takahashi et al. | ......... 438/384 |
| 5,792,681 A | * | 8/1998 | Chang et al. | ......... 438/210 |
| 6,323,079 B1 | * | 11/2001 | Takeshita | ......... 438/238 |
| 2002/0142540 A1 | * | 10/2002 | Katayama | ......... 438/239 |

* cited by examiner

*Primary Examiner*—Trung Dang
(74) *Attorney, Agent, or Firm*—Winston Hsu

(57) ABSTRACT

A gate oxide layer, a first polysilicon layer, a polycide layer and a first interpolysilicon oxide (IPO) layer are sequentially formed on a semiconductor substrate. The first IPO layer, the polycide layer and the first polysilicon layer are then etched to form a gate and a bottom electrode plate. A second IPO layer and a polysilicon layer are then formed on the substrate and are etched to form a conductive wire and a top electrode plate thereafter. Finally, a spacer is formed, and an ion implantation process and a self-aligned suicide (salicide) process are performed to complete a mixed mode process for the formation of the conductive wire, a metal-oxide-semiconductor (MOS) transistor and a capacitor structure.

22 Claims, 8 Drawing Sheets

MIXED MODE PROCESS

BACKGROUND OF THE INVENTION

1. Field of the Invention

The present invention relates to an integration circuit (IC) process, and more specifically, to a mixed mode process for IC manufacturing.

2. Description of the Prior Art

A metal-oxide semiconductor (MOS) transistor is a common electrical device used in integrated circuits. The MOS transistor is a unit, having four nodes, formed by a gate, a source and a drain. By utilizing channel effects generated by the gate of the MOS under different gate voltages, the MOS is often made to function as a digitalized solid switch applied on various integrated circuits of memory or logic devices.

Please refer to FIG. 1 of a perspective view of a MOS transistor 12 according to the prior art. As shown in FIG. 1, the MOS transistor 12 is formed on a substrate 10 and comprises a gate oxide layer 14, a gate 16 formed atop the gate oxide layer 14, a spacer 18 formed on either sides of the gate 16 and two doped areas, employed as a source 20 and a drain 22, formed in portions of the substrate 10 adjacent to either sides of the MOS transistor 12. Normally, a self-aligned silicide (salicide) process is performed to form a silicide layer 26 on surfaces of the source 20 and the drain 22. In order to prevent the silicide layer 26 from being formed on a top surface of the gate 16 during the salicide process, a cap layer 24, comprising silicon oxide, is formed on the top surface of the gate 16 before the salicide layer 26 is formed.

In addition to the MOS transistor, a capacitor is also a frequently applied device in semiconductor circuits. In semiconductor processing, a capacitor on a semiconductor wafer is designed with a bottom electrode plate and a top electrode plate electrically isolated by a dielectric layer between the bottom and top electrode plates at a predetermined distance. When a voltage is applied to the two electrode plates, charge is stored between them. The capacitance of the capacitor varies due to the amount of stored charge, which is directly related to the surface area of the two electrode plates and the dielectric constant of the dielectric layer, as well as to the material used for the dielectric layer.

Please refer to FIG. 2 of the perspective view of a capacitor 28 according to the prior art. As shown in FIG. 2, a silicon substrate 30 comprises a field oxide layer 32 formed on a surface of the silicon substrate 30. The capacitor 28 is formed on a silicon substrate 30 and comprises a first polysilicon layer 34 formed within a predetermined area on a surface of the field oxide layer 32, a dielectric layer 36 formed on the first polysilicon layer 34 and a second polysilicon layer formed within a predetermined area on a top surface of the dielectric layer 36. Wherein the first and second polysilicon layers 34 and 38 are respectively employed as a bottom electrode plate and a top electrode plate of the capacitor 28, and the dielectric layer 36 is employed as a capacitor dielectric layer of the capacitor 28.

However, the line width in semiconductor manufacturing decreases as technology progresses. It has become an important issue in semiconductor manufacturing to improve the production efficiency by producing the MOS transistor 12 and the capacitor 28 with excellent performance on a wafer with less possible surface area. A new IC manufacturing process is therefore a must.

SUMMARY OF INVENTION

It is therefore a primary object of the present invention to provide a mixed mode process for integration circuits (IC) to improve the manufacturing efficiency during the production of devices with highly integrated circuits.

According to the claimed invention, a semiconductor substrate has a surface comprises at least a conductive region, a metal-oxide-semiconductor (MOS) transistor region and a capacitor region. Portions of the surface of the semiconductor substrate further comprise a field oxide. The mixed mode process begins with sequentially forming a gate oxide layer, a first polysilicon layer, a polycide layer and a first inter-polysilicon oxide (IPO) layer on the semiconductor substrate. A first photo-etching-process (PEP) is then performed to remove portions of the first IPO layer, polycide layer and the first polysilicon layer to simultaneously form a first stacked structure and a second stacked structure respectively in the MOS transistor region and the capacitor region. A second IPO layer and a second polysilicon layer are sequentially formed on the semiconductor substrate thereafter to cover the first and second stacked structures, and a second PEP is performed to remove portions of the second polysilicon layer to simultaneously form a conductive wire and a top electrode plate of a capacitor respectively in the conductive region and on the second stacked structure. A dielectric layer is then formed on the semiconductor substrate to cover the conductive wire, the first stacked structure, the top electrode plate and the second stacked structure. By performing an etching process to remove portions of the dielectrice layer and the second IPO layer, a spacer is formed on either sides of the conductive wire, the top electrode plate and the second stacked structure. Finally, a self-aligned silicide (salicide) process is performed to form a silicide layer respectively on the conductive wire, top electrode plate and portions of the surface of the semiconductor substrate adjacent to either side of the first stacked structure in the MOS transistor region.

It is an advantage of the present invention against the prior art that the conductive wire, the MOS transistor and the capacitor are simultaneously formed on the silicon substrate with the least number of steps to improve the production efficiency without influencing the performance of the wire, the MOS transistor and the capacitor. In addition, the first and second IPO layers, employed as a capacitor dielectric layer of the capacitor in the present invention, have a same composition. The stability of the capacitance of the capacitor is therefore assured. Besides, the salicide layer formed on the top electrode plate can significantly reduce the resistance of the top electrode plate to increase the product life of the capacitor. Consequently, the mixed mode process revealed in the present invention can be applied in the production for device with highly integrated circuits to achieve a strong competitiveness of the product.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
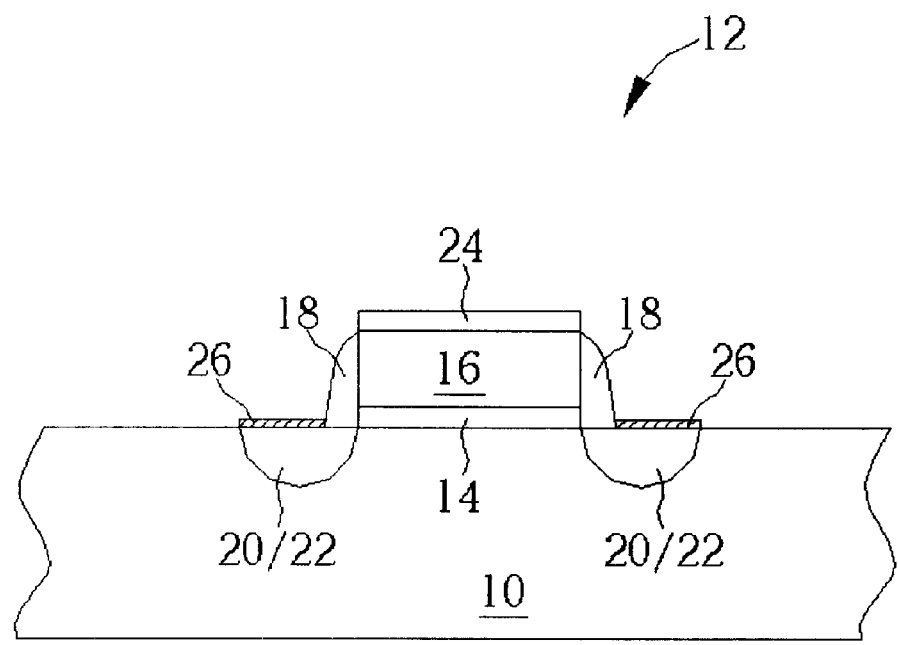
FIG. 1 is a perspective view of a MOS transistor 12 according to the prior art.
Figure 2:
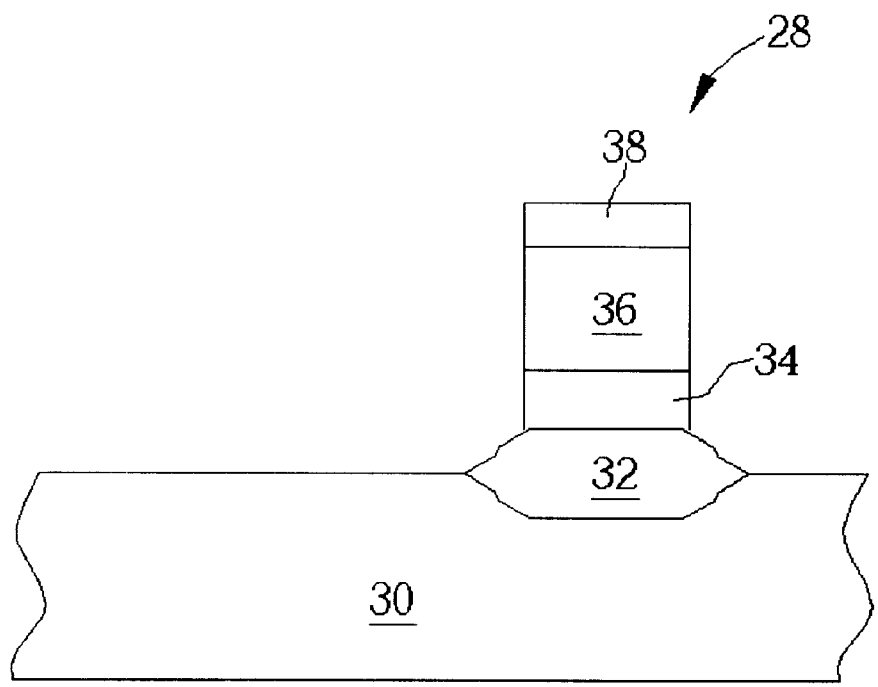
FIG. 2 is the perspective view of a capacitor according to the prior art.
Figure 3:
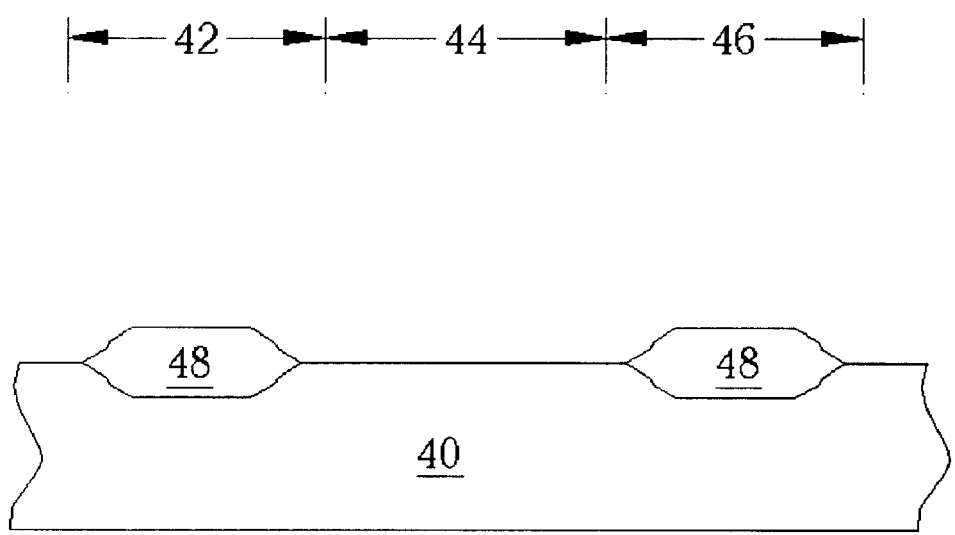
FIG. 3 to FIG. 8 are schematic views of a mixed mode process according to the present invention.

Please refer to FIG. 3 to FIG. 8 of schematic views of a mixed mode process according to the present invention. As shown in FIG. 3, a semiconductor substrate 40 has a surface comprising at least a conductive region 42, a metal-oxide-semiconductor (MOS) transistor region 44 and a capacitor region 46. Either portions of the surface of the semiconductor substrate 40 within the conductive region 42 or the capacitor region 46 further comprises a field oxide layer 48.

Figure 4:
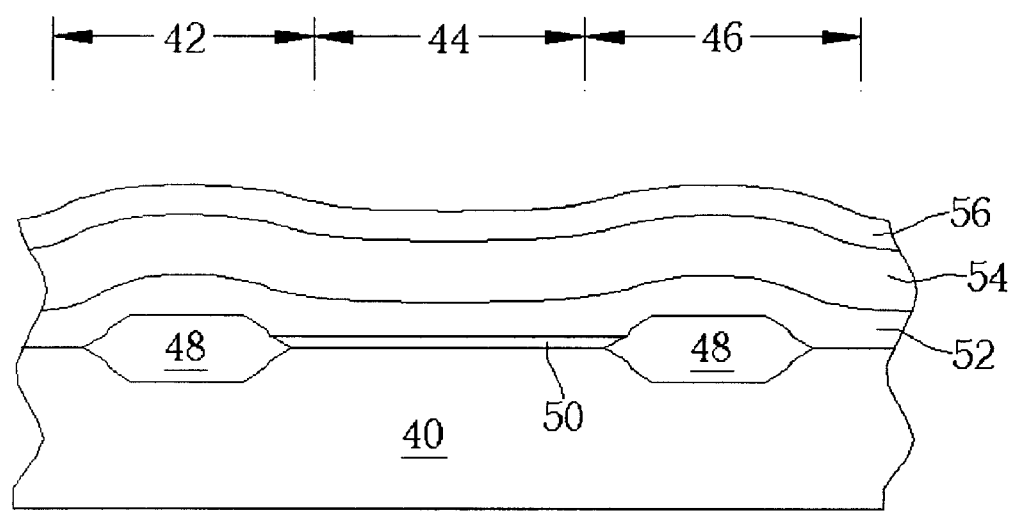

As shown in FIG. 4, a gate oxide layer 50, a first conductive layer, a silicide layer and a first oxide layer are sequentially formed on the semiconductor substrate 40. Normally, the first conductive layer is a first polysilicon layer 52, the silicide layer is a polycide layer 54, and the first oxide layer is a inter-polysilicon oxide layer 56, as shown in FIG. 4. Wherein the polycide layer 54 comprises tungsten silicide and is formed by performing a sputtering process and a rapid thermal process (RTP). For simplicity of description, steps employed to form the polycide layer 54 are neglected in the present embodiment.

Figure 5:
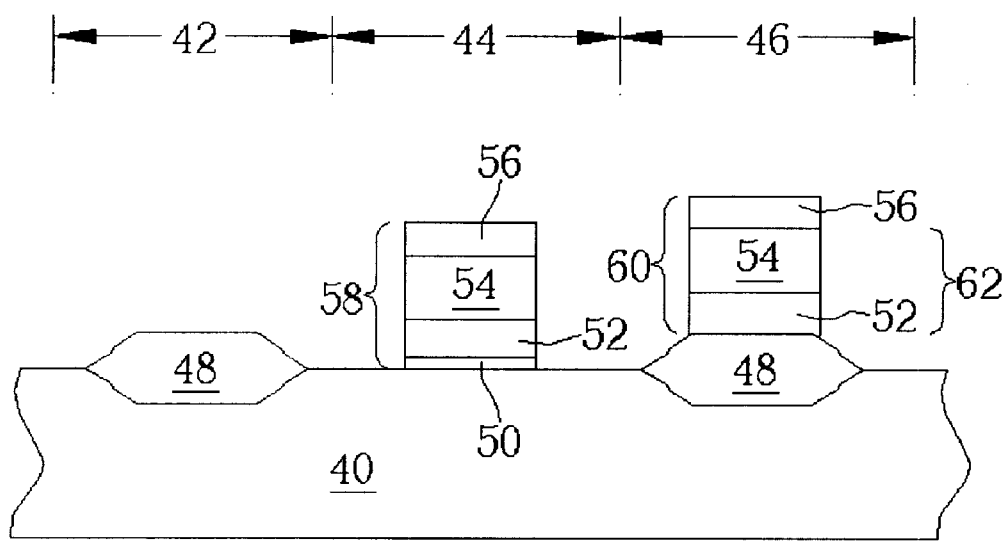

As shown in FIG. 5, a first photo-etching-process (PEP) is performed to remove portions of the first IPO layer 56, polycide layer 54, first polysilicon layer 52 and the gate oxide layer 50 to simultaneously form a first stacked structure 58 and a second stacked structure 60 respectively within the MOS transistor region 44 and the capacitor region 46. Wherein portions of the first polysilicon layer 52 and the polycide layer 54 in the first stacked structure 58 are employed as a gate of a MOS transistor of the integration circuits, and portions of the polycide layer 54 and the first polysilicon layer 52 in the second stacked structure 60 are employed as a bottom electrode plate 62 of a capacitor structure of the integration circuit.

Figure 6:
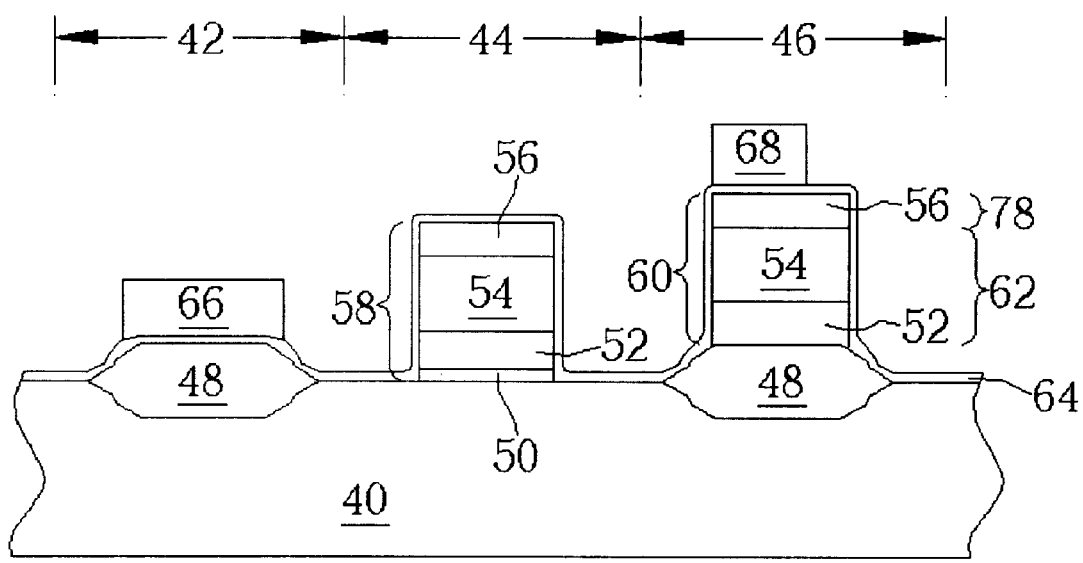

As shown in FIG. 6, a second oxide layer and a second conductive layer (not shown) are sequentially formed on the semiconductor substrate 40 to cover the first stacked structure 58 and the second stacked structure 60 thereafter. Normally, the second oxide layer is a second IPO layer 64, and the second conductive layer is a second polysilicon layer (not shown), as shown in FIG. 6. By using the second IPO layer 64 as a stop layer, a second PEP is performed to remove portions of the second polysilicon layer to simultaneously form a conductive wire 66, composed of the second polysilicon layer, and a top electrode plate 68, composed of the second polysilicon layer, of the capacitor structure mentioned in the previous paragraph respectively within the conductive region 42 and on the second stacked structure 60. Wherein portions of the first and second IPO layers 56 and 64 between the top electrode plate 68 and the bottom electrode plate 62 are employed as a capacitor dielectric layer 78 of the capacitor structure, and the conductive wire 66 is optionally employed as a resistor of the integration circuits depending on the layout of the integration circuits.

Figure 7:
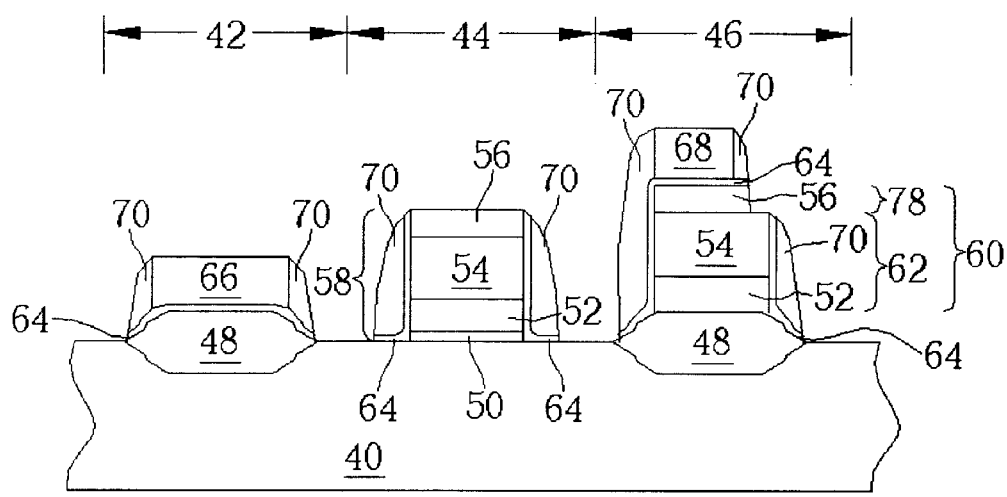

As shown in FIG. 7, a dielectric layer (not shown), comprising tetra-ethyloxysilane (TEOS), is formed on the semiconductor substrate 40 to cover the conductive wire 66, the first stacked structure 58, the top electrode plate 68 and the second stacked structure 60. By using surfaces of the field oxide layers 48, the semiconductor substrate 40 and the polycide layer 54 as a stop layer, an etching process is performed to remove portions of the dielectric layer, the second IPO layer 64 and the first IPO layer 56 to form a spacer 70 on either sides of the conductive wire 66, the first stacked structure 58, the top electrode plate 68 and the second stacked structure 60. Optionally, a plug (not shown) is formed on exposed portions of the surface of the second IPO layer 64 to electrically connect with another semiconductor device (not shown), and an ion implantation process may be performed to form a lightly doped drain (LDD) before the spacer 70 is formed.

Figure 8:
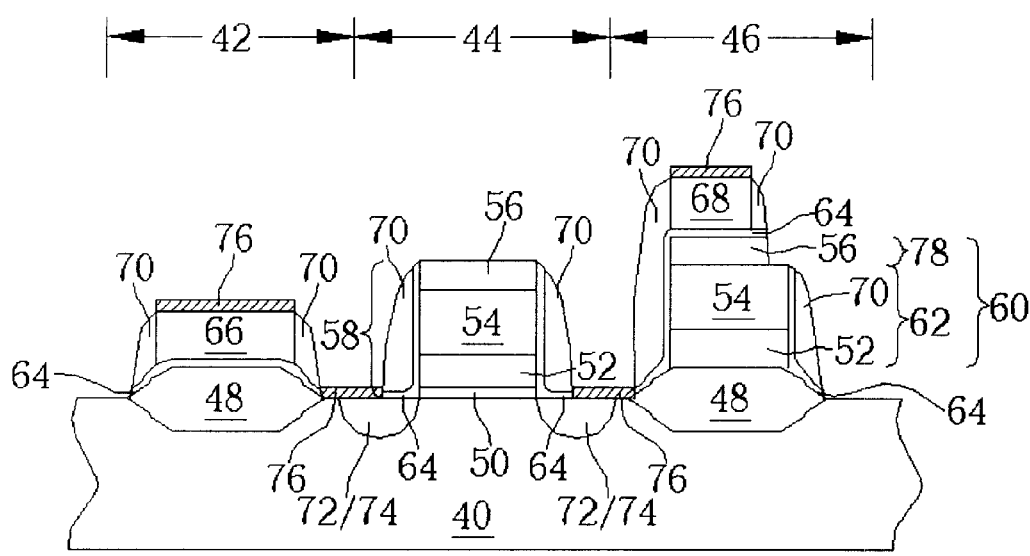

As shown in FIG. 8, by performing an ion implantation process, a source 72 and a drain 74 of the MOS transistor is formed in portions of the semiconductor substrate 40 adjacent to either sides of the first stacked structure 58. A salicide block (SAB) process is then performed to define a non-salicide region (not shown) on the surface of the semiconductor substrate 40. Finally, a self-aligned silicide (salicide) process is performed to form a silicide layer 76 respectively on the conductive wire 66, the top electrode plate 68 and portions of the surface of the semiconductor substrate 40 adjacent to either sides of the first stacked structure 58 in the MOS transistor region 44.

In comparison with the prior art, the present invention provides a mixed mode process to simultaneously form the conductive wire 66, the MOS transistor and the capacitor structure on the silicon substrate 40 with the least number of steps to improve the production efficiency without influencing the performance of the wire 66, the MOS transistor and the capacitor structure. In addition, portions of the first and second IPO layers 56 and 64, having a same composition, are employed as the capacitor dielectric layer 78 of the capacitor structure. The stability of the capacitance of the capacitor structure is therefore assured. Besides, the salicide layer 76 formed on the top electrode plate 68 can significantly reduce the resistance of the top electrode plate 68 to increase the product life of the capacitor structure. Consequently, the mixed mode process revealed in the present invention can be applied in the production for devices with highly integrated circuits to achieve a strong competitiveness of the product.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A mixed mode process for integration circuits comprising:

providing a semiconductor substrate, a surface of the semiconductor substrate comprising at least a conductive region, a metal-oxide-semiconductor (MOS) transistor region and a capacitor region;

sequentially forming a gate oxide layer, a first conductive layer, a first silicide layer and a first oxide layer on the semiconductor substrate;

performing a first photo-etching-process (PEP) to remove portions of the first oxide layer, first silicide layer and the first conductive layer to simultaneously form a first stacked structure and a second stacked structure respectively in the MOS transistor region and the capacitor region;

sequentially forming a second oxide layer and a second conductive layer on the semiconductor substrate to cover the first and second stacked structures;

performing a second PEP to remove portions of the second conductive layer to simultaneously form a conductive wire and a top electrode plate of a capacitor respectively in the conductive region and on the second stacked structure;

forming a dielectric layer on the semiconductor substrate to cover the conductive wire, the first stacked structure, the top electrode plate and the second stacked structure;

performing an etching process to remove portions of the dielectric layer and the second oxide layer to form a spacer on either sides of the conductive wire, the top electrode plate and the second stacked structure; and performing a self-aligned silicide (salicide) process to form a second silicide layer respectively on the conductive wire, the top electrode plate and portions of the surface of the semiconductor substrate adjacent to either sides of the first stacked structure in the MOS transistor region.

2. The mixed mode process of claim 1 wherein the first and second conductive layers comprise polysilicon, the first and second oxide layers comprises interpolysilicon oxide (IPO), and the first silicide layer comprises polycide.

3. The mixed mode process of claim 1 wherein portions of the first conductive layer and the first silicide layer in the first stacked structure are employed as a gate of a MOS transistor of the integration circuits.

4. The mixed mode process of claim 3 wherein an ion implantation process is further performed to form a source and a drain of the MOS transistor in portions of the semiconductor substrate adjacent to either sides of the first stacked structure.

5. The mixed mode process of claim 1 wherein portions of the first suicide layer and the first conductive layer in the second stacked structure are employed as a bottom electrode plate of the capacitor, and portions of the first and second oxide layers between the top electrode plate and the bottom electrode plate are employed as a capacitor dielectric layer of the capacitor.

6. The mixed mode process of claim 1 wherein the first suicide layer comprises tungsten silicide.

7. The mixed mode process of claim 1 wherein the second PEP utilizes the second oxide layer as a stop layer.

8. The mixed mode process of claim 1 wherein the dielectric layer comprises tetra-ethyloxysilane (TEOS).

9. The mixed mode process of claim 1 wherein either portions of the surface of the semiconductor substrate within the conductive region or the capacitor region comprise a field oxide layer.

10. The mixed mode process of claim 9 wherein surfaces of the field oxide layer and the semiconductor substrate are employed as a stop layer for the etching process used for the formation of the spacer.

11. The mixed mode process of claim 1 wherein a salicide block (SAB) process is performed to define a non-salicide region on the surface of the semiconductor substrate before the salicide process is performed.

12. The mixed mode process of claim 1 wherein the conductive wire in the conductive region is employed as a resistor of the integration circuits.

13. A mixed mode process for integration circuits comprising:

providing a semiconductor substrate, a surface of the semiconductor substrate comprising at least a conductive region, a MOS transistor region and a capacitor region, either one of the conductive region and the capacitor region comprises a field oxide layer formed on the semiconductor substrate;

sequentially forming a gate oxide layer, a first conductive layer and a first silicide layer on the semiconductor substrate;

performing a first PEP to remove portions of the first silicide layer and the first conductive layer to simultaneously form a first stacked structure and a second stacked structure respectively in the MOS transistor region and the capacitor region;

sequentially forming a first oxide layer and a second conductive layer on the semiconductor substrate to cover the first and second stacked structures;

performing a second PEP to remove portions of the second conductive layer to simultaneously form a conductive wire and a top electrode plate of a capacitor respectively in the conductive region and on the second stacked structure;

forming a dielectric layer on the semiconductor substrate to cover the conductive wire, the first stacked structure, the top electrode plate and the second stacked structure;

performing an etching process to remove portions of the dielectric layer and the first oxide layer to form a spacer on either sides of the conductive wire, the top electrode plate and the second stacked structure;

performing an ion implantation process to form a doped region in portions of the semiconductor substrate adjacent to either sides of the first stacked structure; and performing a salicide process to form a second silicide layer respectively on the conductive wire, the top electrode plate and portions of the surface of the semiconductor substrate adjacent to either sides of the first stacked structure in the MOS transistor region.

14. The mixed mode process of claim 13 wherein the first and second conductive layers comprise polysilicon, the first and second oxide layers comprises inter-polysilicon oxide (IPO), and the first silicide layer comprises polycide.

15. The mixed mode process of claim 13 wherein the first suicide layer comprises a second oxide layer formed atop the polycide layer.

16. The mixed mode process of claim 15 wherein portions of the first silicide layer and the first conductive layer in the second stacked structure are employed as a bottom electrode plate of the capacitor, and portions of the first and second oxide layers between the top electrode plate and the bottom electrode plate are employed as a capacitor dielectric layer of the capacitor.

17. The mixed mode process of claim 13 wherein portions of the first conductive layer and the first silicide layer in the first stacked structure are employed as a gate of a MOS transistor of the integration circuits, and the doped region is employed as either a source or a drain of the MOS transistor.

18. The mixed mode process of claim 13 wherein the first silicide layer comprises tungsten silicide, and the dielectric layer comprises TEOS.

19. The mixed mode process of claim 13 wherein the second PEP utilizes the first oxide layer as a stop layer.

20. The mixed mode process of claim 13 wherein surfaces of the field oxide layer and the semiconductor substrate are employed as a stop layer for the etching process used for the formation of the spacer.

21. The mixed mode process of claim 13 wherein a SAB process is performed to define a non-salicide region on the surface of the semiconductor substrate before the salicide process is performed.

22. The mixed mode process of claim 13 wherein the conductive wire in the conductive region is employed as a resistor of the integration circuits.

* * * * *